United States Patent [19]
Edelman

[11] Patent Number: 6,009,341
[45] Date of Patent: Dec. 28, 1999

[54] THREE-DIMENSIONAL MAGNETIC RESONANCE ANGIOGRAPHY OF CORONARY ARTERIES

[75] Inventor: Robert R. Edelman, Newton, Mass.

[73] Assignee: Beth Israel Deconess Medical Center, Inc., Boston, Mass.

[21] Appl. No.: 09/036,084

[22] Filed: Mar. 6, 1998

[51] Int. Cl.⁶ .................................................. A61B 5/055
[52] U.S. Cl. ........................ 600/413; 600/419; 600/509
[58] Field of Search .................................. 600/413, 419, 600/509, 521; 324/307, 309

[56] References Cited

U.S. PATENT DOCUMENTS

| | | | |
|---|---|---|---|
| 4,777,957 | 10/1988 | Wehrli | 128/653 |
| 5,277,182 | 1/1994 | Koizumi et al. | 128/653.3 |
| 5,377,680 | 1/1995 | Bernstein et al. | 128/653.2 |
| 5,477,144 | 12/1995 | Rogers | 324/309 |
| 5,692,508 | 12/1997 | Simonetti et al. | 128/653.3 |
| 5,857,970 | 1/1999 | Purdy | 600/413 |

*Primary Examiner*—Brian L. Casler
*Attorney, Agent, or Firm*—Mark H. Jay

[57] ABSTRACT

To conduct a three-dimensional MRA study of the coronary arteries, the locations in space of the arteries is determined using a scout MR study. Segments (composed of phase-encoding lines, three-dimensional partitions, or both) are created in the volume of interest, each one relating to a particular coronary artery of interest. MR data relating to each one of the segments are acquired during a single cardiac cycle, and at times when the individual coronary arteries of interest are relatively motionless. Advantageously, a paramagnetic contrast agent is used to increase the MR signal from blood, and the study is conducted during a single breath hold.

13 Claims, 2 Drawing Sheets

THREE-DIMENSIONAL MAGNETIC RESONANCE ANGIOGRAPHY OF CORONARY ARTERIES

BACKGROUND OF THE INVENTION

The invention relates to magnetic resonance (MR) imaging, and more particularly relates to magnetic resonance angiography (MRA) of the coronary arteries. In its most immediate sense, the invention relates to three-dimensional MRA of the coronary arteries.

Radiologists have long sought to conduct three-dimensional MRA studies on human coronary arteries. However, such efforts have not been successful. To be diagnostically useful, the images must be free of motion artifacts, must have sufficient contrast between tissue and blood, and must have a minimum level of spatial resolution. And, to be practical, the MRA study must not take too long.

It has heretofore been impossible to produce three-dimensional cardiac MRA images that are not only diagnostically useful, but practical as well. This is because cardiac motion creates motion artifacts in the MRA image. If the study is carried out using techniques that acquire MR image data sufficiently quickly that such artifacts are absent, the study becomes too lengthy. If the study is shortened, spatial resolution and tissue contrast get traded off against the presence of motion artifacts.

One object of the invention is to provide a method for imaging a patient's coronary arteries in such a manner that motion artifacts are minimized while permitting the study to be completed in a practical time.

Another object of the invention is to provide such a method in which adequate spatial resolution and tissue contrast need not be traded off against the presence of motion artifacts in the image.

Another object is, in general, to improve on methods of this general type.

The invention proceeds from the realization that the coronary arteries do not all move at the same time and that there is a time during the cardiac cycle when each coronary artery is relatively motionless. Hence, if MR data could be acquired from each coronary artery at a time when the artery of interest was essentially motionless, motion artifacts would (if not eliminated) be at least greatly reduced.

The invention also proceeds from the realization that it is possible to segment the volume of interest so as to correspond to the stationary positions of the coronary arteries of interest. In this way, the MR data collection can be restricted to regions where the data are important. Because of this, the study can be conducted more rapidly.

In accordance with the invention, a volume of interest (VOI) is established. The VOI includes all the coronary arteries to be imaged. Then, the VOI is divided into a plurality of segments. Each segment relates to a part of a coronary artery that remains relatively motionless during a corresponding portion of the patient's cardiac cycle. Thereafter, magnetic resonance (MR) data are acquired for each of the plurality of segments. For each segment, this data acquisition takes place during the corresponding portion of the patient's cardiac cycle.

Hence, in accordance with the invention, little motion is occurring while MR data are being acquired. Therefore, motion artifacts are largely absent from the reconstructed image. Furthermore, because data collection is limited only to particular segments of the VOI, the study can be conducted rapidly.

In accordance with the preferred embodiment, MR data are acquired from each one of the segments during a single cardiac cycle. During each successive cardiac cycle, more MR data are acquired from each one of the segments. This process is continued until sufficient data have been acquired.

Advantageously, and in further accordance with the preferred embodiment, the entire MR data acquisition takes place during a single breath hold. This minimizes body motion during the acquisition, which produces an image of improved diagnostic quality. Alternatively, respiratory gating methods can be used to reduce motion artifacts, including the use of navigator techniques that monitor cardiac or diaphragm motion.

Further advantageously, the MR data acquisitions are carried out using an MR pulse sequence of a type in which blood is rendered bright in a reconstructed MR image. Alternatively, or additionally, it is possible to administer a paramagnetic contrast agent to the patient before conducting the MRA study, thereby increasing the intensity of the blood signal.

BRIEF DESCRIPTION OF THE DRAWINGS

The invention will be better understood with reference to the accompanying exemplary and non-limiting drawings, in which.

DETAILED DESCRIPTION OF PREFERRED EMBODIMENTS

Figure 1:
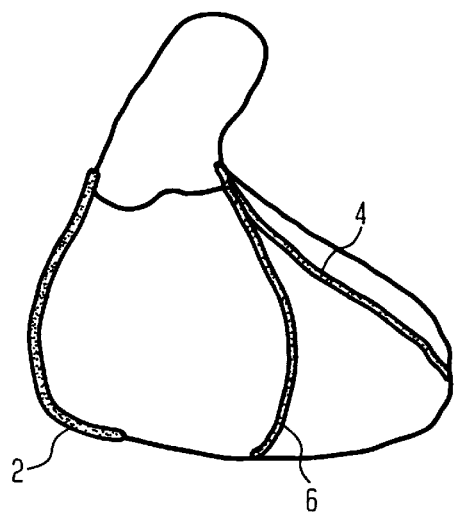
FIG. 1 illustrates the coronary arteries to be imaged in MRA.

FIG. 1 shows, together with other coronary arterial structure, the right coronary artery 2, the left anterior descending coronary artery 4, and the left circumflex coronary artery 6. These arteries 2, 4 and 6 move during the patient's cardiac cycle, and such movement can introduce motion artifacts in a reconstructed MR image.

However, persons skilled in the art know that the movements of the arteries 2, 4 and 6 are closely tied to the patient's cardiac cycle. For example, during the systolic phase of the cardiac cycle, and particularly near the end of systole, the right coronary artery is essentially motionless, i.e. it moves very little as compared to its rapid motion during portions of diastole. Likewise; the left anterior descending coronary artery 4 and the left circumflex coronary artery 6 are essentialy motionless during various period in diastole; movement of these arteries takes place largely during systole.

In accordance with the invention, the volume of interest is segmented to correspond to the arteries 2, 4, and 6. This is advantageously done using an MR "scout study", i.e. a short, low-resolution study that is not of diagnostic quality but nonetheless provides some information about the patient's body.

In this example, each of the segments S1, S2, S3 and S4 is a three-dimensional partition that is excited by an RF pulse during an MR pulse sequence. However, the segments need not be so defined; they may additionally, or alternatively, be defined in terms of the phase-encoding lines in k-space that are required to form MR images of the segments S1, S2, S3, S4.

Figure 2:
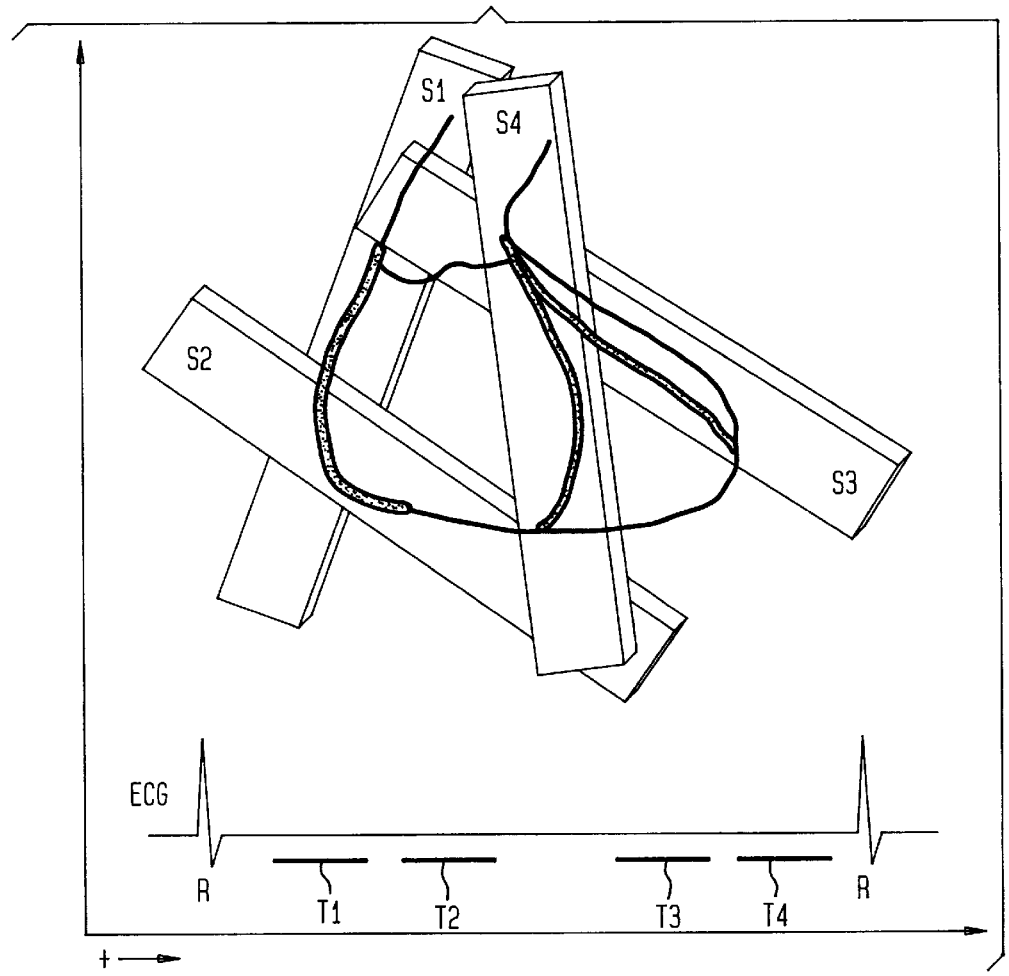
FIG. 2 schematically illustrates the physical basis for a preferred embodiment of the invention.

In accordance with the invention, MR data are acquired from the segments S1, S2, S3, S4 only during times when the arteries 2, 4, and 6 are relatively motionless. And, in accordance with the preferred embodiment, this is done in such a manner that MR data are acquired from each of the segments S1, S2, S3, and S4 during a single cardiac cycle. As can be seen in FIG. 2, MR data are acquired from segment S1 during time T1, which is shortly after systole commences. Thereafter, during time T2 (which occurs near the end of systole), MR data are acquired from segment S2. Subsequently, during time T3, which is shortly after diastole, MR data are acquired from segment S3. Still later, but still during the same cardiac cycle and at the end of diastole just before the next R-wave during time T4, MR data are acquired from the segment S4.

Hence, in accordance with the invention, the acquisition of MR data from the various segments takes place at times (during the cardiac cycle) when cardiac motion is unlikely to occur. As a result, the reconstructed MR images of the segments will be relatively free of motion artifacts.

Advantageously, and in accordance with the preferred embodiment, the MR pulse sequence used to acquire the MR data is of a type which makes blood bright in the reconstructed MR image. Typically, a three-dimensional segmented gradient-echo, spiral, or segmented echo planar pulse sequence would be used, although it would alternatively be possible to use a fast multislice two-dimensional sequence. Further advantageously, and likewise in accordance with the preferred embodiment, the MR data acquisition is synchronized to the patient's cardiac cycle, as by ECG gating (in response to electrical signals from the heart) or pulse gating (in response to changes in bloodflow in a finger or other body part). In accordance with the preferred embodiment, such gating is carried out by mounting a sensor to the patient and using the signal from the sensor to trigger acquisition of MR data.

To increase the brightness of blood in the reconstructed MR image, a paramagnetic contrast agent (such as Gd-DPTA) is advantageously administered to the patient before acquisition of MR data. Although this is preferred, it is not required.

As is known to persons skilled in the art, to acquire MR data sufficient to reconstruct a three-dimensional image of one of the segments, it is necessary to fill a k-space matrix by acquiring lines at different phase-encoding gradients. In accordance with the preferred embodiment, each k-space matrix (in this example, the four k-space matrices corresponding to segments S1, S2, S3, and S4) is gradually filled up during successive cardiac cycles. Thus, for example, if a k-space matrix is to contain lines of MR data taken at 12 different phase-encoding gradients, 3 lines might be acquired during the first cardiac cycle, 3 lines during the next cardiac cycle, and so on until the matrix has been filled up after the fourth cardiac cycle has been completed.

Because the quantity of MR data to be acquired is limited, it is possible to complete the coronary MRA study in a relatively short time. Advantageously, and in accordance with the preferred embodiment, the study is carried out during a single breath hold, which can be expected to last for at least 15 seconds, i.e. for at least 10–30 cardiac cycles. Alternatively, if the study must last longer than a single breath hold, respiratory gating methods can be used to reduce motion artifacts. Such gating methods include navigator techniques that monitor cardiac or diaphragm motion.

Figure 3:
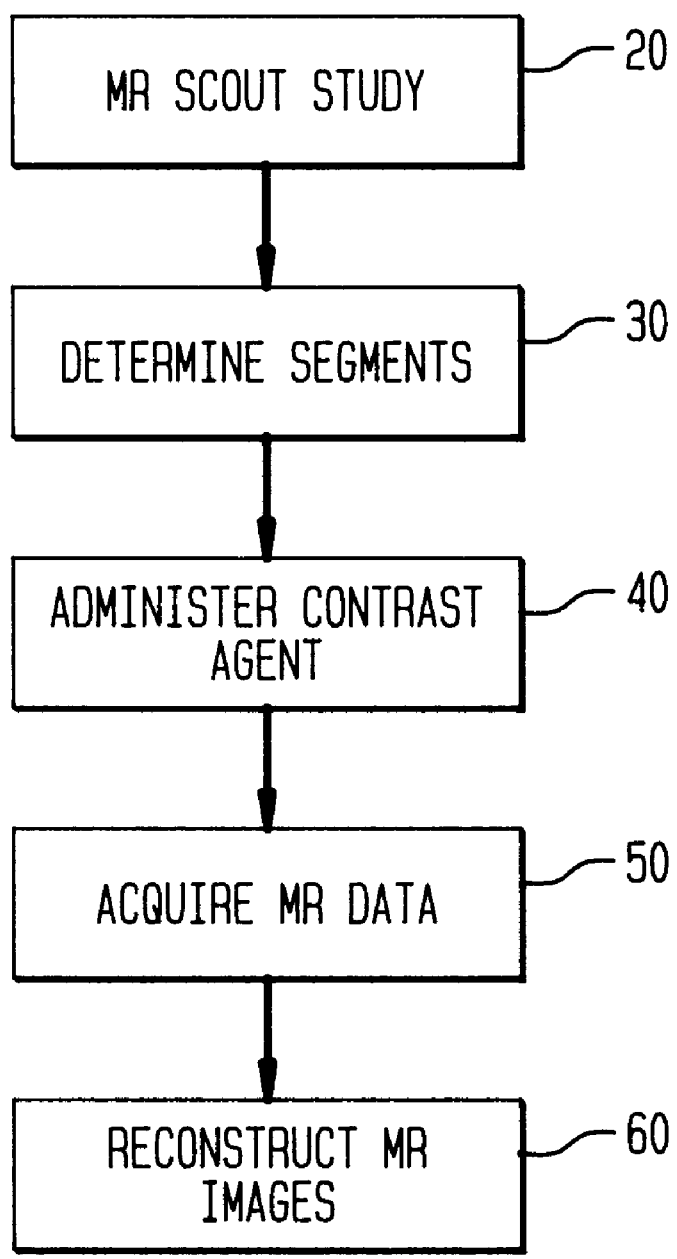
FIG. 3 is a flowchart illustrating the preferred embodiment of the invention.

Hence, in accordance with the preferred embodiment as illustrated in FIG. 3, a scout study step 20 is initially carried out to locate the coronary arteries of interest. (In this example, the coronary arteries are the right coronary artery 2, the left anterior descending coronary artery 4, and the left circumflex coronary artery 6, but this is not required. Because each artery is essentially motionless during a particular part of the cardiac cycle, the selection of the arteries of interest constitutes an identification of the particular parts of the cardiac cycle during which the MR data are to be acquired.)

From this scout study step 20, a plurality of segments are determined in step 30, as by specifying three-dimensional partitions, phase-encoding lines, or both. The segments are dimensioned to encompass the arteries of interest without also including too much moving body structure. In this example, there are four segments S1, S2, S3, and S4, but this is not required; there may be more or fewer. The number of phase-encoding lines is determined by a) the spatial resolution required and b) the tissue contrast required.

Next, a paramagnetic contrast agent (such as Gd-DTPA) is administered to the patient in step 40. This enhances the blood signal. Although this step is preferred because the study can be shortened; it may not be required. Furthermore, although it is presently preferred that step 40 follow step 30, this need not be so. It is only necessary that the contrast agent have been administered before the commencement of MR data acquisition, as is set forth in more detail below.

Acquisition of MR data can then begin, in step 50. During this step, a sensor (not shown) is connected to the patient and used to gate the data acquisition process in response to the patient's pulse or ECG. The patient is instructed to hold his or her breath, in order to minimize body motion from respiration. During each cardiac cycle, and while the patient is holding his or her breath, at least one line of MR data is read out from each one of the segments S1, S2, S3, and S4, at times when the arteries in those segments are relatively motionless. MR data acquisition continues for a predetermined number of cardiac cycles, until four k-space matrices (each corresponding to one of the segments S1, S2, S3, and S4) have been filled with lines of MR data.

The acquisition process carried out in step 50 can use different MR pulse sequences to acquire the MR data. In general, such sequences will usually be T1-weighted, three-dimensional pulse sequences that make blood appear bright in the reconstructed MR image. Presently preferred sequences are three-dimensional segmented gradient-echo, spiral, or segmented echo planar pulse sequences.

After step 50 has concluded, the MR data is used, in step 60, to reconstruct images from the segments S1, S2, S3, and S4.

While one or more preferred embodiments have been described above, the scope of the invention is limited only by the following claims:

1. A method of acquiring magnetic resonance data from a patient's coronary arteries in synchronism with the patient's cardiac cycle, comprising the following steps:

establishing a volume of interest that includes all coronary arteries to be imaged;

dividing the volume of interest into a plurality of segments, each segment relating to a part of a coronary artery that remains relatively motionless during a corresponding portion of the patient's cardiac cycle; and acquiring magnetic resonance (MR) data from each of the plurality of segments, said acquiring step being carried out, for each segment, during said corresponding portion of the patient's cardiac cycle.

2. The method of claim 1, wherein said establishing step comprises the step of carrying out a scout study.

3. The method of claim 2, wherein the scout study is an MR study.

4. The method of claim 1, wherein said dividing step comprises the step of identifying, for each segment, a corresponding three-dimensional partition.

5. The method of claim 1, wherein said dividing step comprises the step of identifying, for each segment, a corresponding set of phase-encoding lines in k-space.

6. The method of claim 1, wherein MR data are acquired from each of the plurality of segments during a single cardiac cycle.

7. The method of claim 6, further comprising the step of repeating said acquiring step during a plurality of cardiac cycles.

8. The method of claim 1, wherein said acquiring step is carried out using a three-dimensional MR pulse sequence of a type in which blood is rendered bright in a reconstructed MR image.

9. The method of claim 1, wherein said acquiring step is carried out using a fast multislice two-dimensional MR pulse sequence of a type in which blood is rendered bright in a reconstructed MR image.

10. The method of claim 1, wherein a paramagnetic contrast agent is administered to the patient before said acquiring step is carried out.

11. The method of claim 1, wherein said acquiring step is carried out by synchronizing MR data acquisition to the patient's cardiac cycle.

12. A method of acquiring magnetic resonance data from a patient's coronary arteries in synchronism with the patient's cardiac cycle and during a single breath hold, comprising the following steps:

conducting a scout study and thereby establishing a volume of interest that includes all coronary arteries to be imaged;

dividing the volume of interest into a plurality of segments, each segment relating to a part of a coronary artery that remains relatively motionless during a corresponding portion of the patient's cardiac cycle;

acquiring, during a single cardiac cycle encompassing all of said corresponding portions, magnetic resonance (MR) data from each one of the plurality of segments, said acquiring step being carried out using a T1-weighted three-dimensional MR pulse sequence of a type in which blood is rendered bright in a reconstructed MR image; and repeating said acquiring step during said single breath hold.

13. A method of acquiring magnetic resonance data from a patient's coronary arteries in synchronism with the patient's cardiac cycle, comprising the following steps:

conducting a scout study and thereby establishing a volume of interest that includes all coronary arteries to be imaged;

dividing the volume of interest into a plurality of segments, each segment relating to a part of a coronary artery that remains relatively motionless during a corresponding portion of the patient's cardiac cycle;

acquiring, during a single cardiac cycle encompassing all of said corresponding portions, magnetic resonance (MR) data from each one of the plurality of segments, said acquiring step being carried out using a T1-weighted three-dimensional MR pulse sequence of a type in which blood is rendered bright in a reconstructed MR image; and repeating said acquiring step in synchronism with the patient's respiration.

* * * * *